(12) United States Patent
Park et al.

(10) Patent No.: US 9,679,943 B2
(45) Date of Patent: Jun. 13, 2017

(54) SEMICONDUCTOR DEVICE

(71) Applicants: Jong Chul Park, Seongnam-si (KR); Shin Jae Kang, Seoul (KR); Shin Kwon, Yongin-si (KR); Kyung Rae Byun, Suwon-si (KR)

(72) Inventors: Jong Chul Park, Seongnam-si (KR); Shin Jae Kang, Seoul (KR); Shin Kwon, Yongin-si (KR); Kyung Rae Byun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/710,740

(22) Filed: May 13, 2015

(65) Prior Publication Data

US 2016/0104745 A1     Apr. 14, 2016

(30) Foreign Application Priority Data

Oct. 8, 2014 (KR) .................... 10-2014-0135745

(51) Int. Cl.
| | |
|---|---|
| *H01L 43/08* | (2006.01) |
| *H01L 27/22* | (2006.01) |
| *G11C 11/16* | (2006.01) |
| *H01L 43/10* | (2006.01) |

(52) U.S. Cl.
CPC .......... *H01L 27/228* (2013.01); *G11C 11/161* (2013.01); *H01L 43/10* (2013.01)

(58) Field of Classification Search
CPC ......... H01L 43/08; H01L 43/02; H01L 43/10; H01L 43/12; H01L 27/228; H01L 45/04; H01L 45/06; H01L 27/105; H01L 27/101; G11C 11/161
See application file for complete search history.

(56) References Cited

U.S. PATENT DOCUMENTS

| | | | |
|---|---|---|---|
| 5,750,433 A | 5/1998 | Jo | |
| 6,448,630 B1 | 9/2002 | Komori | |
| 6,723,648 B2 | 4/2004 | Choi | |
| 8,084,347 B2 | 12/2011 | Chen et al. | |
| 2004/0108561 A1* | 6/2004 | Jeong | H01L 27/228 257/422 |
| 2005/0070033 A1* | 3/2005 | Kajiyama | H01L 27/228 438/3 |
| 2005/0128794 A1* | 6/2005 | Sussner | H01L 27/226 365/158 |
| 2008/0225576 A1* | 9/2008 | Zhong | H01L 27/222 365/158 |

(Continued)

FOREIGN PATENT DOCUMENTS

JP     4987830 B2     7/2012

*Primary Examiner* — Jarrett Stark
*Assistant Examiner* — Bitew Dinke
(74) *Attorney, Agent, or Firm* — Harness, Dickey & Pierce, P.L.C.

(57) ABSTRACT

A semiconductor device may include a first magnetic layer including a plurality of first regions configuring a plurality of memory cells and spaced apart from each other on a substrate, and a second region encompassing the plurality of first regions and electrically isolated from the first regions, a tunnel barrier layer disposed on the first magnetic layer, and a second magnetic layer disposed on the tunnel barrier layer.

20 Claims, 21 Drawing Sheets

(56) References Cited

U.S. PATENT DOCUMENTS

| | | | | |
|---|---|---|---|---|
| 2010/0053823 A1* | 3/2010 | Iwayama | ............... | B82Y 25/00 360/324.2 |
| 2010/0232210 A1* | 9/2010 | Kajiyama | ............... | G11C 11/16 365/148 |
| 2011/0064969 A1* | 3/2011 | Chen | ............... | B82Y 25/00 428/800 |
| 2011/0073917 A1* | 3/2011 | Zhong | ............... | H01L 21/76819 257/208 |
| 2012/0112298 A1* | 5/2012 | Kim | ............... | G11C 11/02 257/421 |
| 2013/0001506 A1* | 1/2013 | Sato | ............... | H01L 27/228 257/5 |
| 2013/0029431 A1* | 1/2013 | Takahashi | ............... | H01L 43/12 438/3 |
| 2013/0037862 A1* | 2/2013 | Kitagawa | ............... | H01L 43/08 257/252 |
| 2013/0043530 A1* | 2/2013 | Kim | ............... | H01L 27/105 257/334 |
| 2013/0149499 A1* | 6/2013 | Lee | ............... | H01L 43/12 428/156 |
| 2013/0171743 A1* | 7/2013 | Lee | ............... | H01L 43/12 438/3 |
| 2014/0117477 A1* | 5/2014 | Park | ............... | H01L 27/228 257/421 |
| 2014/0250244 A1* | 9/2014 | Song | ............... | G06F 3/0673 710/5 |
| 2014/0264672 A1* | 9/2014 | Park | ............... | H01L 27/228 257/421 |
| 2015/0069555 A1* | 3/2015 | Sakai | ............... | H01L 43/08 257/421 |
| 2015/0091109 A1* | 4/2015 | Allinger | ............... | H01L 23/552 257/421 |
| 2015/0194599 A1* | 7/2015 | Park | ............... | H01L 43/12 438/3 |
| 2016/0093669 A1* | 3/2016 | Lee | ............... | H01L 27/222 257/421 |

* cited by examiner

SEMICONDUCTOR DEVICE

CROSS-REFERENCE TO RELATED APPLICATION

This application claims the benefit of priority from Korean Patent Application No. 10-2014-0135745, filed on Oct. 8, 2014, with the Korean Intellectual Property Office, the disclosure of which is incorporated herein by reference in its entirety.

BACKGROUND

Example embodiments relate to a semiconductor device.

In accordance with the implementation of high speed operations and low power consumption in electronic products, semiconductor devices embedded therein are typically required to provide rapid reading/writing operations while operating at a low level operating voltage. Thus, a magnetic random access memory (MRAM) and a memory device storing data using a phenomenon of resistance change of a magnetoresistive element, has been proposed. The MRAM may operate at a relatively high rate and may have nonvolatile characteristics. Currently, research into a spin transfer torque magnetic random access memory (STT-MRAM) that may be advantageous in improving recording density is being actively undertaken.

SUMMARY

Example embodiments may provide a semiconductor device having improved reliability.

According to example embodiments, a semiconductor device may include a first magnetic layer including first regions configuring a plurality of memory cells and spaced apart from each other on a substrate, and a second region encompassing the first regions and electrically isolated from the first regions, a tunnel barrier layer disposed on the first magnetic layer, and a second magnetic layer disposed on the tunnel barrier layer.

The first regions may be arranged in rows and columns, and the second region may be provided as a single layer and disposed in the vicinity of the first regions to encompass the first regions.

The second region may be spaced apart from the first regions with substantially uniform gaps formed along circumferences of the first regions.

The semiconductor device may further include an isolation insulating layer disposed between the first region and the second region.

A width of the isolation insulating layer may be narrower than a width of the first region.

An upper surface of the isolation insulating layer may be disposed on the same plane as an upper surface of the first magnetic layer.

The first regions may have respective circular shapes in a plane parallel to an upper surface of the substrate.

The semiconductor device may further include a lower electrode disposed below each of the first regions and electrically connected to the first regions.

The lower electrode may include a contact plug electrically connected to a selection device, and a lower electrode layer disposed on the contact plug, and the lower electrode layer may be also disposed below the second region.

A region of the lower electrode layer, disposed below the second region, may be electrically isolated from the contact plug.

The tunnel barrier layer may be provided as a single layer covering the first magnetic layer.

The tunnel barrier layer may be disposed along the first magnetic layer to have a single pattern and may have a lateral surface coplanar with a lateral surface of the first magnetic layer.

The semiconductor device may further include a protective layer disposed on the first magnetic layer.

The second magnetic layer may be provided as a single layer covering the tunnel barrier layer.

The second magnetic layer and the tunnel barrier layer may have a pattern corresponding to a pattern of the first magnetic layer.

The first magnetic layer may have a changeable magnetization direction.

According to example embodiments, a semiconductor device may include magnetic memory elements disposed on a substrate to configure a plurality of memory cells and including a first magnetic layer, a tunnel barrier layer contacting the first magnetic layer, and a second magnetic layer contacting the tunnel barrier layer, selection devices disposed on the substrate or within the substrate. The first magnetic layer may include first regions electrically connected to the selection devices and spaced apart from each other and a second region encompassing the first regions and electrically isolated from the first regions.

The semiconductor device may further include bit lines electrically connected to the selection devices.

The semiconductor device may further include selection lines electrically connected to the selection devices, and bit lines electrically connected to the magnetic memory elements.

According to example embodiments, a semiconductor device may include magnetic memory elements disposed on a substrate to configure a plurality of memory cells and including a first magnetic layer, a tunnel barrier layer contacting the first magnetic layer, and a second magnetic layer contacting the tunnel barrier layer. The first magnetic layer may include first regions spaced apart from each other, and a second region encompassing the first regions and electrically isolated from the first regions.

BRIEF DESCRIPTION OF DRAWINGS

The above and other example embodiments, features and other advantages will be more clearly understood from the following detailed description taken in conjunction with the accompanying drawings, in which.

DETAILED DESCRIPTION

Figure 1:
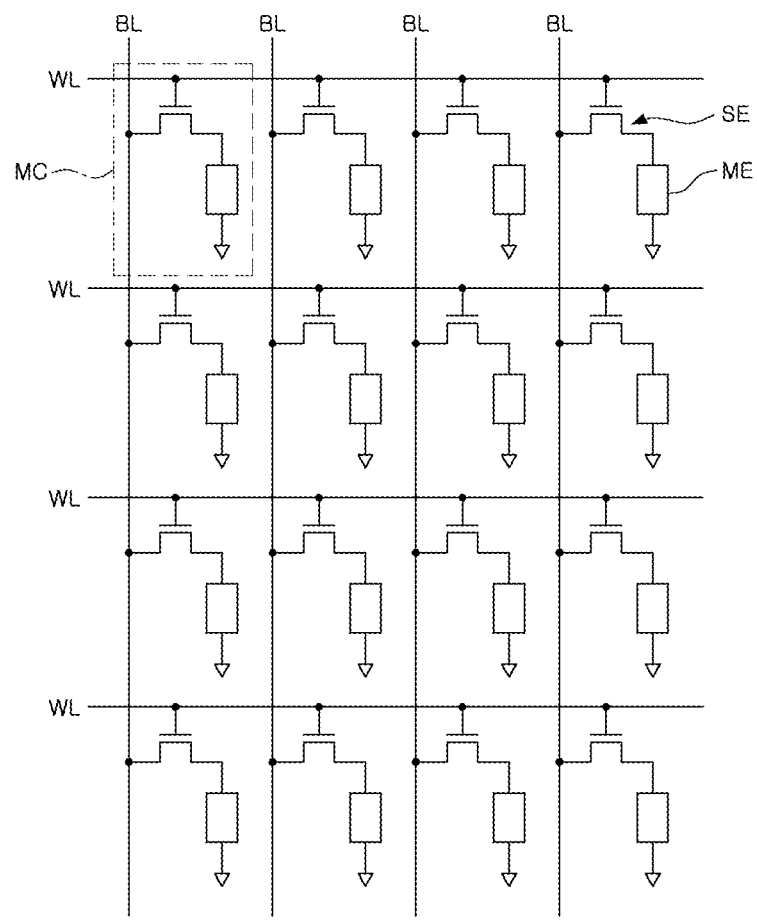
FIG. 1 is a circuit diagram of a memory cell array of a semiconductor device according to an example embodiment.

Example embodiments will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

In the drawings, the shapes and dimensions of elements may be exaggerated for clarity, and the same reference numerals will be used throughout to designate the same or like elements.

The terms used herein for explaining embodiments have been disclosed for illustrative purposes, and they are for specifically explaining the example embodiments. Singular forms are intended to include plural forms unless the context clearly indicates otherwise. The terms "comprise" and/or "comprising" will be understood to imply the inclusion of stated constituents, steps, operations and/or elements but not the exclusion of any other constituents, steps, operations and/or elements. The term 'and/or' will be understood to imply all of any one of and one or more combinations of described corresponding items.

While terms such as "first" and "second," etc., may be used to describe various components, regions, layers, etc., such terms must not be understood as being limited to the above terms. Such terms are used only to distinguish one component, region, layer, etc. from another. For example, a first component may be referred to as a second component without departing from the scope of the example embodiments, and likewise a second component may be referred to as a first component.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a circuit diagram of a memory cell array of a semiconductor device according to an example embodiment.

With reference to FIG. 1, a plurality of memory cell units MC may be arranged two-dimensionally or three-dimensionally. The plurality of memory cell units MC may be connected between word lines WL and bit lines BL intersecting each other. The respective memory cell units MC may include a magnetic memory element ME including a magnetoresistive element and a selection device SE. The selection device SE and the memory element ME may be electrically connected to each other in series. The magnetic memory element ME may be connected to one terminal of the selection device SE, and the bit line BL may be connected to the selection device SE, but the example configuration is not limited thereto. For example, in an example embodiment, the magnetic memory element ME may also be connected between the bit line BL and the selection device SE.

The magnetic memory element ME may include a magnetic tunnel junction (MTJ). A level of resistance of the MTJ may be changed according to a magnetization direction of a free layer. For example, when a magnetization direction of the free layer coincides with the magnetization direction of a pinned layer, the MTJ may have a relatively low level of resistance, and in the opposite case, the MTJ may have a relatively high level of resistance. In a semiconductor device, for example, when the MTJ has relatively low resistance, data thereof may correspond to '0', and when the MTJ has relatively high resistance, data thereof may correspond to '1'.

The selection device SE may be configured to selectively control a flow of charge flowing through the magnetic tunnel junction. The selection device SE may be provided as, for example, one of a diode, a bipolar transistor and a field-effect transistor.

Figure 2:
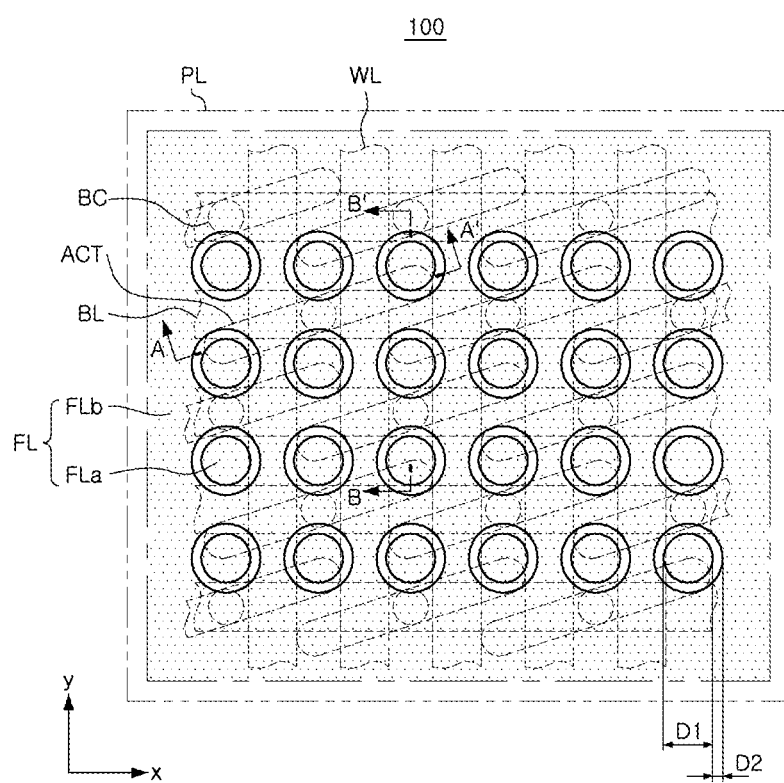
FIG. 2 is a schematic layout diagram of a memory cell array of a semiconductor device according to an example embodiment.

FIG. 2 is a schematic layout diagram of a memory cell array of a semiconductor device according to an example embodiment. Here, a portion of constituent elements disposed in boundary regions is omitted from FIG. 2.

With reference to FIG. 2, the layout of a portion of constituent elements in a memory cell array region included in a semiconductor device 100 is schematically illustrated. The semiconductor device 100 may include a plurality of active regions ACT, a plurality of word lines WL and a plurality of bit lines BL intersecting each other substantially perpendicularly, and a free layer FL and a pinned layer PL configuring the magnetic memory element ME (see FIG. 1).

The layout of FIG. 2 illustrates a dispositional relationship between illustrated constituent elements and a connection relationship therebetween, and the sizes and shapes of respective constituent elements in the semiconductor device 100 may thus be variously implemented according to example embodiments.

The active regions ACT may be two-dimensionally arranged to have a desired interval therebetween in an x direction while being arranged to alternate with each other in a y direction. The active regions ACT may have a rectangular shape or a bar shape extending in a direction of a desired angle with respect to extension directions of the word lines WL and the bit and the bit lines BL. In the active regions ACT, regions thereof not intersecting the word lines WL may be provided as source regions or drain regions of the selection devices SE (see FIG. 1) configured by the word lines WL.

The word lines WL may extend in a single direction, for example, in a y direction, across the active regions ACT. For example, two word lines WL may be disposed across one active region ACT. In this case, a pair of selection devices SE such as, for example, transistors, may be disposed on the active region ACT. The bit lines BL may extend in a single direction, for example, in the x direction, to be substantially perpendicular to the word lines WL.

In the case of one active region ACT, a source region of the selection device SE may be formed between two word lines WL across the active region ACT, and drain regions of the selection device SE may be formed outwardly of two word lines WL, respectively. The source region and the drain regions may be formed using a substantially identical impurity by a doping process or an ion implantation process, and may be reversely referred to as, for example, the drain regions and the source region according to circuit configuration.

Bit line contact plugs BC may be formed in the source regions. The bit line contact plugs BC may electrically connect the source regions to the bit lines BL. The bit line contact plugs BC may apply a source voltage to the selection devices SE configured by adjacent bit lines WL.

The free layer FL configuring the magnetic memory elements ME may be connected to the drain regions. The free layer FL may include first and second regions FLa and FLb.

A magnetic memory element ME may include one first region FLa. Although the first region FLa is illustrated as being disposed on a boundary thereof in the y direction on both end portions of the active region ACT, a detailed disposition of the first region FLa is not limited thereto. A width D1 of the first region FLa may be variously changed according to example embodiments.

The second region FLb may be spaced apart from the respective first regions FLa by a desired distance D2 while encompassing the first regions FLa, and may be provided as a single layer in the vicinity of the first regions FLa. The second region FLb and the first region FLa may be spaced apart from each other with distance D2 therebetween that is, for example, smaller than the width D1 of the first region FLa, but not limited thereto. The second region FLb may be spaced apart from the first regions FLa along circumferences thereof and may have a substantial uniform gap therebetween.

The pinned layer PL may have a single plate shape to cover the free layer FL while being disposed above the free layer FL. In detail, as the free layer FL includes the first and second regions FLa and FLb, flatness thereof may be achieved, and crystalline properties of the pinned layer PL disposed on the free layer FL may be achieved. Thus, degradation of magnetic memory element ME characteristics may be reduced or substantially prevented.

Figure 3:
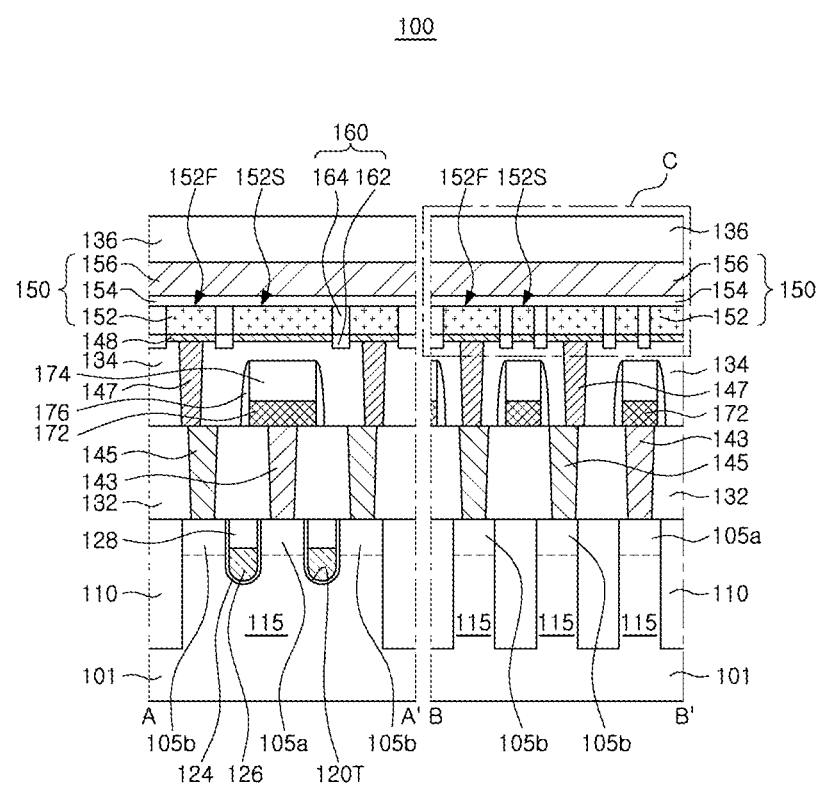
FIG. 3 is a schematic cross-sectional view of a memory cell array of a semiconductor device according to an example embodiment.

FIG. 3 is a cross sectional view of a memory cell array of a semiconductor device according to an example embodiment. FIG. 3 illustrates a portion of a region including a cross section taken along lines A-A' and B-B' of FIG. 2.

With reference to FIG. 3, a semiconductor device 100 may include a substrate 101, a device isolation layer 110 disposed in the substrate 101, an active region 115 defined by the device isolation layer 110 in the substrate 101, a word line 126 buried in the substrate 101, a bit line 172 disposed on the substrate 101, and a magnetic memory element 150. The semiconductor device 100 may further include a first contact plug 143 connecting the bit line 172 to the active region 115, a second contact plug 145 connecting the active region 115 to the magnetic memory element 150, a third contract plug 147, and a lower electrode layer 148.

The substrate 101 may have an upper surface extending in x and y directions. The substrate 101 may include, for example, a group IV semiconductor, a group III-V compound semiconductor, or a II-VI oxide semiconductor. For example, a group IV semiconductor may include silicon, germanium, or silicon-germanium. The substrate 101 may be provided as a bulk wafer layer, an epitaxial layer, a silicon-on-insulator (SOI) layer, a semiconductor-on-insulator (SeOI), or the like.

The device isolation layer 110 may be formed using an insulating material. The device isolation layer 110 may be formed by, for example, a shallow trench isolation (STI) process. The device isolation layer 110 may be formed using or include, for example, oxide, nitride, or combinations thereof.

The active region 115 may be defined by the device isolation layer 110, and a first impurity region 105a and a second impurity region 105b may be formed in the active region 115 to serve as a source region or a drain region. The first and second impurity regions 105a and 105b may extend from an upper surface of the active region 115 to the inside of the substrate 101 at a desired depth from an upper surface of the active region 115. The first impurity region 105a may be disposed between a pair of word lines 126 passing through one active region 115, and the second impurity region 105b may be disposed outwardly of the word lines 126 in one active region 115. The first and second impurity regions 105a and 105b may include impurities having different conductivity types from the impurities of the active region 115.

The word lines 126 may be buried in the substrate 101 so that two word lines pass through each active region 115. The word line 126 may be formed in a trench 120T and may have an upper surface having a level lower than the level of an upper surface of the active region 115. The word line 126 may include a metal, metal nitride, or doped polysilicon. An upper surface of the word line 126 may be covered with a gate cap layer 128. The gate cap layer 128 may include, for example, a silicon nitride layer. A gate insulating layer 124 may be disposed between the word line 126 and the active region 115. The gate insulating layer 124 may include oxide, nitride, and oxynitride. The gate insulating layer 124 may include, for example, a silicon oxide layer or an insulating layer having a high dielectric constant.

Although the example embodiment illustrates the case in which the word line 126 is a buried word line configuring a buried channel array transistor (BCAT), example embodiments are not limited thereto.

A bit line 172 may be disposed above the word line 126 to extend in a direction perpendicular to a direction in which the word line 126 extends. An upper layer 174 disposed on the bit line 172 may include an insulating material or a conductive material. For example, when the upper layer 174 includes a conductive material, the upper layer 174 together with the bit line 172 may serve as a wiring line. A spacer layer 176 may be further disposed on a sidewall of the bit line 172 and the upper layer 174.

The first and second contact plugs 143 and 145 may penetrate through a first interlayer insulating layer 132 covering the word lines 126. The first contact plug 143 may be disposed on the first impurity region 105a to be connected to the bit line 172. The second contact plug 145 may be disposed on the second impurity region 105b to be connected to the third contact plug 147 provided thereon.

The second interlayer insulating layer 134 may cover the first and second contact plugs 143 and 145 and the first interlayer insulating layer 132. The third contact plug 147 may penetrate through the second interlayer insulating layer 134. The third contact plug 147 may connect a lower electrode layer 148 of the magnetic memory element 150 to the second contact plug 145 such that the magnetic memory element 150 may be electrically connected to the second impurity region 105b. In FIG. 3, the second contact plug 145 and the third contact plug 147 may be arranged so that centers thereof do not coincide with each other as constituent elements increase a degree of integration thereof. However, example embodiments are not limited to such configuration of the second and third contact plugs 145 and 147.

In one example embodiment, the magnetic memory element 150 may include a first magnetic layer 152, a tunnel barrier layer 154, and a second magnetic layer 156.

The first magnetic layer 152 may be provided as a free layer in which a magnetization direction thereof may be freely changed by an external magnetic field, and may correspond to the free layer FL of FIG. 2. The second magnetic layer 156 may be provided as a single layer having a plate form and disposed above the first magnetic layer 152. The second magnetic layer 156 may be provided as a magnetic layer having a fixed magnetization direction and may correspond to the pinned layer PL of FIG. 2.

The first magnetic layer 152 may include first and second regions 152F and 152S. The first region 152F may be electrically isolated from the second region 152S provided in the vicinity thereof by an isolation insulating layer 160, in a manner that is the same as or similar to that of the first region FLa illustrated in FIG. 2. The lower electrode layer 148 and the third contact plug 147 may be disposed below the first region 152F so as to be electrically connected to the second impurity region 105b.

The second region 152S may be spaced apart from the first region 152F to be disposed in the vicinity of the first region 152F. The lower electrode layer 148 may also be disposed below the second region 152S. Here, the second region 152S may be provided as a dummy first magnetic layer. Thus, the lower electrode layer 148 below the second region 152S may not be connected to the third contact plug 147 and may thus not be electrically connected to the second impurity region 105b. Herein, the term 'dummy' is described as having a structure and a shape that is the same as or similar to other constituent elements, but only represents a pattern without actually performing a function within the semiconductor device 100. Thus, an electrical signal may not be applied to a 'dummy' constituent element or even in a case in which an electrical signal is applied thereto, the 'dummy' constituent element may not perform a corresponding function.

The first and second magnetic layers 152 and 156 may include a ferromagnetic material. The first and second magnetic layers 152 and 156 may include at least one of, for example, cobalt (C), iron (Fe), and nickel (Ni), and may further include other elements, for example, boron (B), chrome (Cr), platinum (Pt), palladium (Pd), and the like. The first and second magnetic layers 152 and 156 may include at least one of CoFeB, CoFe, NiFe, CoFePt, CoFePd, CoFeCr, CoFeTb, CoFeGd, CoFeNi, CoFe, NiFe, and the like.

The first and second magnetic layers 152 and 156 may have a magnetization direction in a direction parallel to a direction of an upper surface of the substrate 101 or in a direction perpendicular thereto. The first magnetic layer 152 may have a changeable magnetization direction, for example, a direction parallel to a direction of the second magnetic layer 156 or a direction anti-parallel thereto. The first and second magnetic layers 152 and 156 may be respectively configured of a plurality of layers.

The tunnel barrier layer 154 may be disposed between the first and second magnetic layers 152 and 156. In an example embodiment, the tunnel barrier layer 154 may cover upper portions of the first magnetic layer 152 and the isolation insulating layer 160 in a manner that is the same as or similar to the second magnetic layer 156. The tunnel barrier layer 154 may include an insulating material. The tunnel barrier layer 154 may include at least one of, for example, magnesium oxide, titanium oxide, aluminum oxide, magnesium-zinc oxide, or magnesium-boron oxide, but is not limited thereto.

A third interlayer insulating layer 136 may be further disposed on the second magnetic layer 156. According to an example embodiment, an additional anti-ferromagnetic material layer may further be disposed on the second magnetic layer 156. The anti-ferromagnetic material layer may include at least one of, for example, PtMn, IrMn, MnO, MnS, MnTe, or MnF, but is not limited thereto.

The isolation insulating layer 160 may include first and second layers 162 and 164. The first layer 162 may be disposed on a lateral surface of the lower electrode layer 148 and may extend into the second interlayer insulating layer 134 to have a desired depth from an upper surface thereof. The second layer 164 may be disposed on a lateral surface of the first magnetic layer 152. An upper surface of the second layer 164 is illustrated as having a surface coplanar with an upper surface of the first magnetic layer 152, but is not limited thereto. For example, according to an example embodiment, a level of the upper surface of the second layer 164 may be lower or higher than the level of the upper surface of the first magnetic layer 152.

According to the example embodiment, since the first magnetic layer 152 includes the first and second regions 152F and 152S and the isolation insulating layer 160 has a relatively small area between the first and second regions 152F and 152S, during a manufacturing process a layer including the first magnetic layer 152 and the isolation insulating layer 160 may be substantially prevented from being planarized non-uniformly. In addition, since the second region 152S is substantially uniformly spaced apart from the first region 152F along a circumference of the first region 152F, symmetry based on the first region 150F may be achieved during a planarization process, and thus, a degree of flatness thereof may further be improved. Thus, the degree of flatness of the layer including the first magnetic layer 152 and the isolation insulating layer 160 may be increased and a degree of flatness of the second magnetic layer 156 may also be achieved.

Figure 4A:
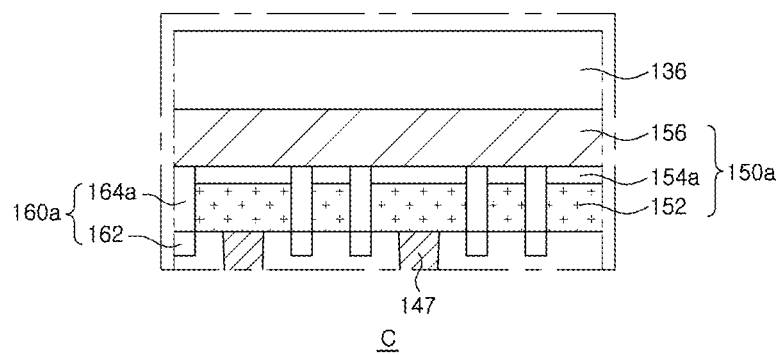
FIGS. 4A and 4B are cross sectional views illustrating magnetic memory elements of a semiconductor device according to an example embodiment and illustrate a region corresponding to region 'C' of FIG. 3.
Figure 4B:
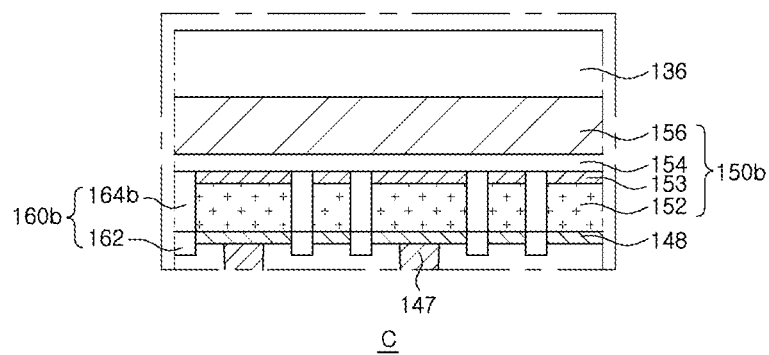

FIGS. 4A and 4B are cross sectional views illustrating magnetic memory elements of a semiconductor device according to an example embodiment and illustrate a region corresponding to region 'C' of FIG. 3.

With reference to FIG. 4A, a magnetic memory element 150a, an isolation insulating layer 160a, a third contact plug 147 and a third interlayer insulating layer 136 of a semiconductor device are illustrated. The magnetic memory element 150a may include a first magnetic layer 152, a tunnel barrier layer 154a, and a second magnetic layer 156.

In detail, the magnetic memory element 150a according to the example embodiment may be disposed so that the tunnel barrier layer 154a forms a pattern corresponding to that of the first magnetic layer 152, in a manner different to that of the example embodiment with reference to FIG. 3. Thus, a second layer 164a of the isolation insulating layer 160a may extend to a lateral surface of the tunnel barrier layer 154a. According to an example embodiment, the tunnel barrier layer 154a may be disposed such that only a portion of a lower portion thereof forms a pattern similarly to the case of the first magnetic layer 152, and a portion of an upper portion thereof may have a plate form as in the example embodiment of FIG. 3.

In the example embodiment, the lower electrode layer 148 according to the example embodiment of FIG. 3 may be omitted from a lower portion of the first magnetic layer 152, and a third contact plug 147 may be directly connected to the first magnetic layer 152.

With reference to FIG. 4B, a magnetic memory element 150b, an isolation insulating layer 160b, a third contact plug 147, a lower electrode layer 148, and a third interlayer insulating layer 136 of a semiconductor device are illustrated. The magnetic memory element 150b may include a first magnetic layer 152, a protective layer 153, a tunnel barrier layer 154, and a second magnetic layer 156.

In detail, the magnetic memory element 150b according to the example embodiment may further include a protective layer 153 disposed on the first magnetic layer 152 in a manner different from that of the example embodiment of FIG. 3. The protective layer 153 may be provided as a layer protecting the first magnetic layer 152 at the time of patterning the first magnetic layer 152 and may include a metal, metal oxide, or a magnetic material. Thus, a second layer 164b of the isolation insulating layer 160b may extend to a lateral surface of the protective layer 153.

Figure 5A:
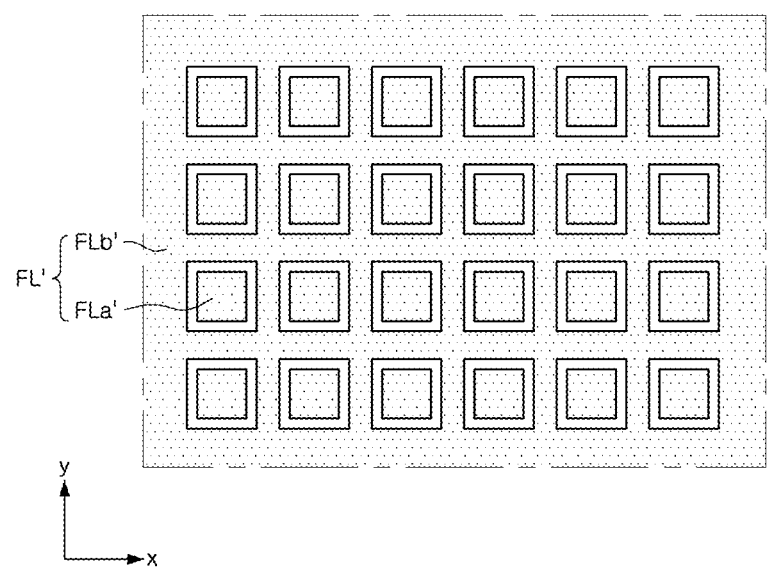
FIGS. 5A and 5B are layout views illustrating magnetic memory elements of a semiconductor device according to an example embodiment.
Figure 5B:
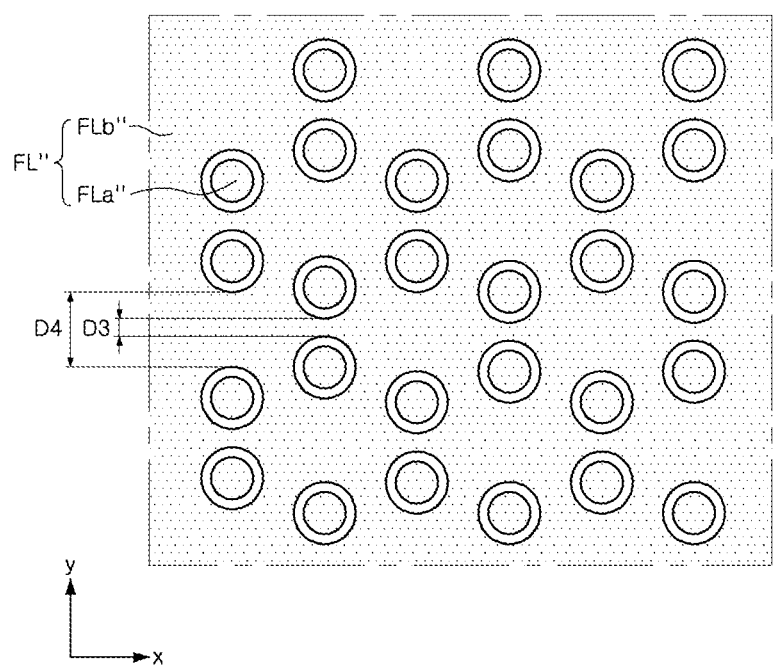

FIGS. 5A and 5B are layout views illustrating magnetic memory elements of a semiconductor device according to an example embodiment.

With reference to FIG. 5A, a free layer FL' configuring a magnetic memory element ME (see FIG. 1) is illustrated. The free layer FL' may include first and second regions FLa' and FLb'. The second region FLb' may be spaced apart from the respective first regions FLa' to have a substantially uniform distance therebetween, encompass the first regions FLa' and may be provided as a single layer in the vicinity of the first regions FLa'.

In detail, in the free layer FL' according to the example embodiment, the first regions FLa' may have a quadrangular shape, not a circular shape, in a manner different from that of the example embodiment of FIG. 2. Thus, in the case of the second region FLb', a surface thereof opposing the first region FLa' may have a quadrangular shape corresponding to that of the first region FLa'. However, a shape of the first region FLa' may be variously changed according to example embodiments, and for example, may have an elliptical shape, a polygonal shape, or a polygonal shape including a curved portion, or the like.

With reference to FIG. 5B, a free layer FL" configuring a magnetic memory element ME (see FIG. 1) is illustrated. The free layer FL" may include first and second regions FLa" and FLb". The second region FLb" may be spaced apart from the respective first regions FLa" to have a substantially uniform distance therebetween, encompass the first regions FLa" and may be provided as a single layer in the vicinity of the first regions FLa".

In detail, in the free layer FL" according to the example embodiment, the first regions FLa" may be disposed in a zigzag form in at least one direction, for example, in an x direction, rather than being arranged in columns and rows in x and y directions. Thus, a distance between first regions FLa" adjacent to each other in the y direction may be represented as two different distances D3 and D4. Such a layout of the first regions FLa" may be determined depending on the integration of a semiconductor device and a disposition of constituent elements based on the integration, and may be variously changed according to example embodiments.

FIGS. 6 to 14 are views illustrating a method of manufacturing a semiconductor device, according to example embodiments. In examples with reference to FIGS. 6 to 14, a method of manufacturing the semiconductor device 100 of FIG. 3 will be described.

Figure 6:
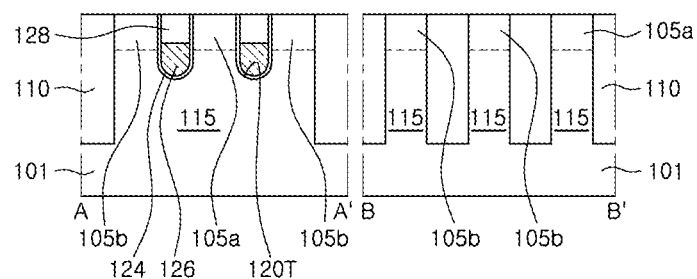
FIGS. 6 to 14 are views illustrating principal processes of a method of manufacturing a semiconductor device according to example embodiments.

With reference to FIG. 6, an active region 115 and word lines 126 may be formed in a substrate 101.

First, the active region 115 may be defined by forming a device isolation layer 110 within the substrate 101. The active region 115 may include first and second impurity regions 105a and 105b formed by implanting impurities into an upper portion thereof to have a desired depth from an upper surface. Depths of the first and second impurity regions 105a and 105b may be shallower than a depth from an upper surface of the active region 115 to a lower surface of the word line 126. The first and second impurity regions 105a and 105b may serve as source or drain regions of transistors formed by the word lines 126. For example, when the word line 126 configures an NMOS, an n-type impurity source such as $PH_3$, $AsH_3$, or the like, may be used in an ion implantation process in which the first and second impurity regions 105a and 105b are formed. In addition, for example, when the word line 126 configures a PMOS, a p-type impurity source such as $BF_3$, $BCl_3$, or the like may be used in the ion implantation process in which the first and second impurity regions 105a and 105b are formed.

Subsequently, the word line 126 may be formed within the active region 115. After a plurality of trenches 120T are formed within the substrate 101, gate insulating layers 124 and the word lines 126 formed of or include a conductive material may be sequentially formed in the trenches 120T. Gate cap layers 128 filling remaining spaces of the trenches 120T may be formed on the word lines 126.

Figure 7:
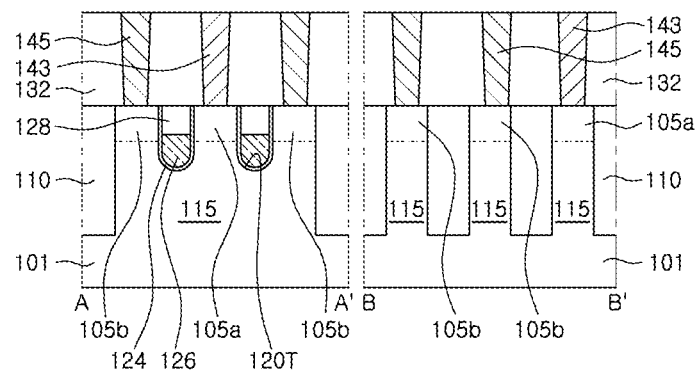

With reference to FIG. 7, a first interlayer insulating layer 132 and first and second contact plugs 143 and 145 may be formed on the substrate 101 in which the active regions 115 and the word lines 126 are formed.

The first interlayer insulating layer 132 may include silicon oxide. Alternatively, the first interlayer insulating layer 132 may include at least one of Boron-Phosphorus Silicate Glass (BPSG), Undoped Silicate Glass (USG), Tetra Ethyl Ortho Silicate (TEOS) or High Density Plasma (HDP) layer.

Contact holes penetrating through the first interlayer insulating layer 132 may be formed by removing a portion of the first interlayer insulating layer 132 using a separate mask layer. Next, the first and second contact plugs 143 and 145 connected to the first and second impurity regions 105a and 105b may be formed by depositing a conductive material in the contact holes. The first and second contact plugs 143 and 145 may include at least one of, for example, doped silicon, tungsten (W), aluminum (Al), titanium (Ti), tantalum (Ta), titanium nitride (TiN), tantalum nitride (TaN), tungsten nitride (WN) and metal silicide.

Figure 8:
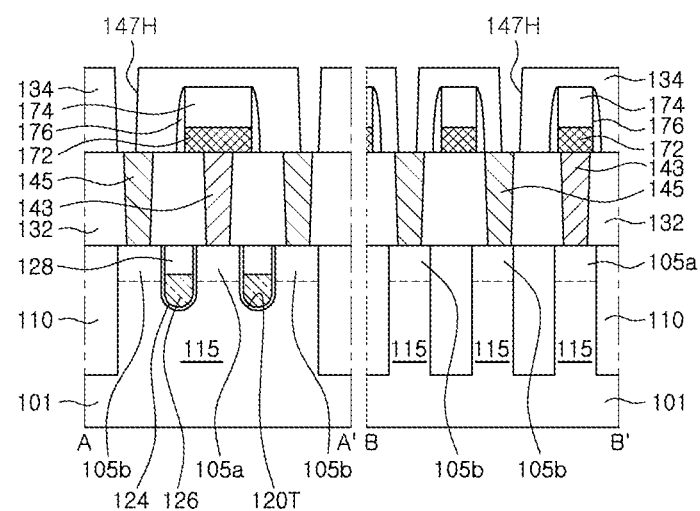

With reference to FIG. 8, a bit line 172 and a second interlayer insulating layer 134 may be formed.

The bit line 172 may be formed on the first contact plug 143 to be connected to the first contact plug 143. An upper layer 174 and a spacer layer 176 may be formed on an upper surface and a lateral surface of the bit line 172, respectively. Subsequently, a second interlayer insulating layer 134 may be formed to cover the bit line 172. A contact hole 147H may be formed by removing a portion of the second interlayer insulating layer 134 such that at least a portion of an upper surface of the second contact plug 145 is exposed thereto.

Figure 9A:
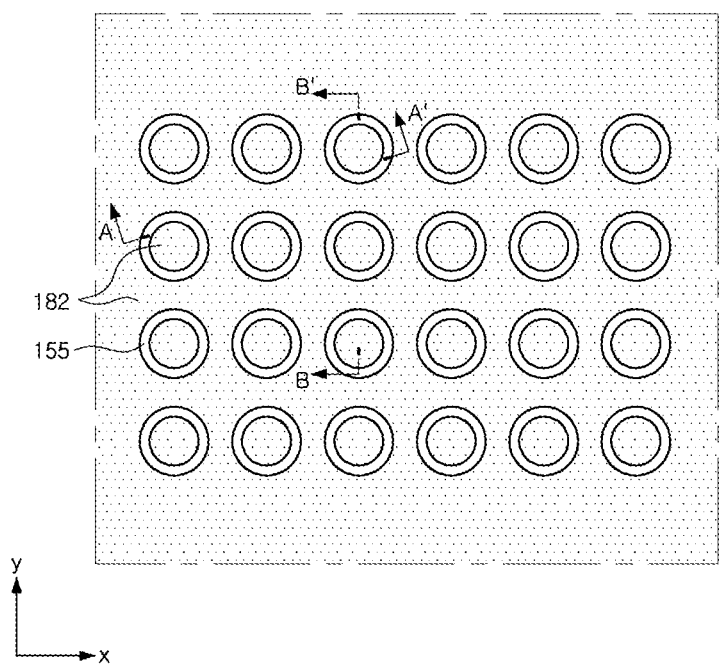
Figure 9B:
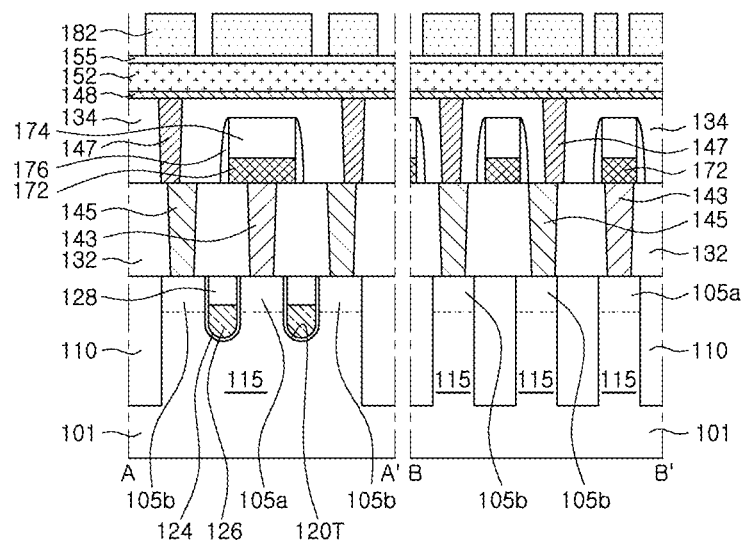

With reference to FIGS. 9A and 9B, a third contact plug 147, a lower electrode layer 148, a first magnetic layer 152, and a magnetic cap layer 155 may be formed.

First, the third contact plug 147 may be formed by depositing a conductive material to fill the contact hole 147H therewith, and the lower electrode layer 148 covering the third contact plug 147 and the second interlayer insulating layer 134 may be formed. The third contact plug 147 and the lower electrode layer 148 also may be formed in situ.

Then, the first magnetic layer 152 and the magnetic cap layer 155 may be formed on the lower electrode layer 148. The magnetic cap layer 155 may be provided as a layer protecting the first magnetic layer 152 during a subsequent process. The first magnetic layer 152 and the magnetic cap layer 155 may be formed by physical vapor deposition (PVD), chemical vapor deposition (CVD), atomic layer deposition (ALD), or the like.

Then, a mask pattern 182 may be formed on the magnetic cap layer 155. The mask pattern 182 may be provided to pattern the first magnetic layer 152 and may have a pattern corresponding to the pattern of the first magnetic layer 152 finally formed as illustrated in FIG. 9A.

Figure 10A:
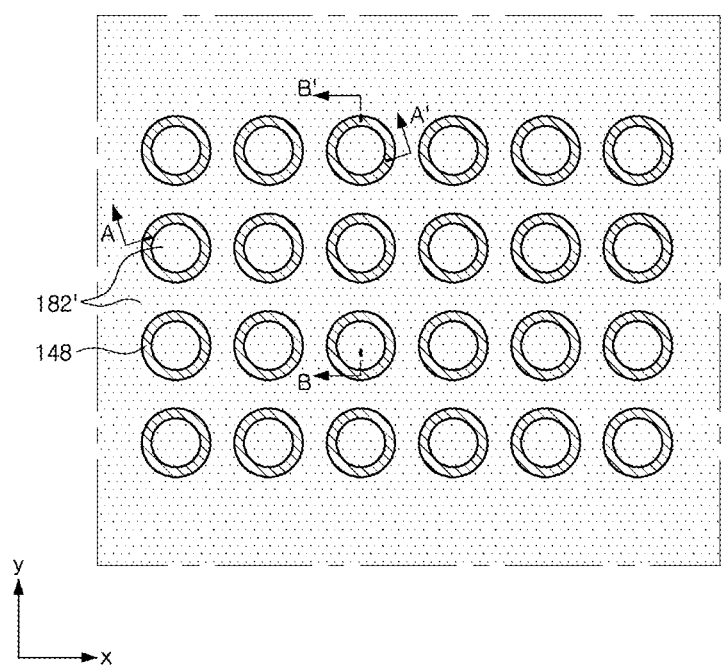
Figure 10B:
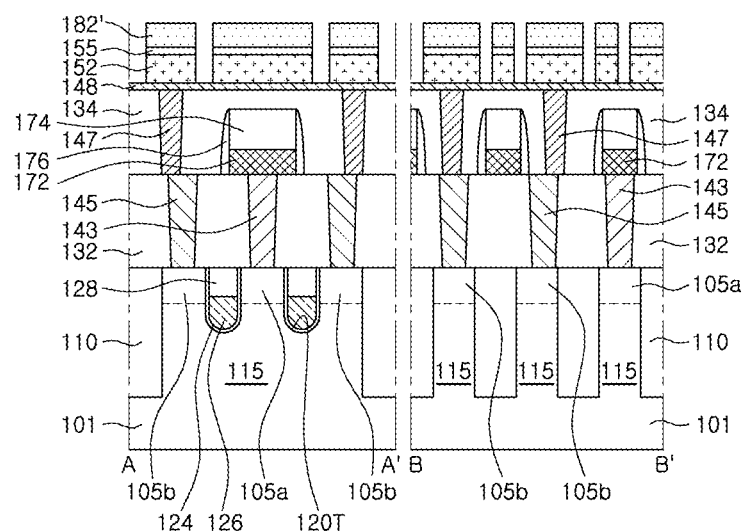

With reference to FIGS. 10A and 10B, the first magnetic layer 152 and the magnetic cap layer 155 may be patterned using the mask pattern 182'.

The patterning may be performed using an etching process such as dry etching, and the lower electrode layer 148 may be used as an etch stop layer. A portion of the mask pattern 182' may also be consumed during the etching process so as to be reduced in a thickness thereof.

In an example embodiment, a portion of the first magnetic layer 152 may not be patterned to thus remain, and in this case, the remaining first magnetic layer 152 may be removed between memory cells in a subsequent process.

Figure 11A:
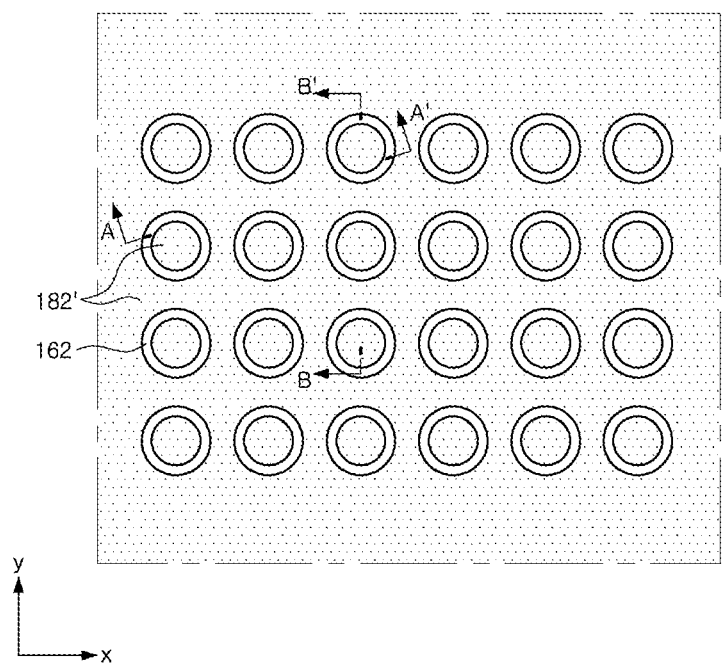
Figure 11B:
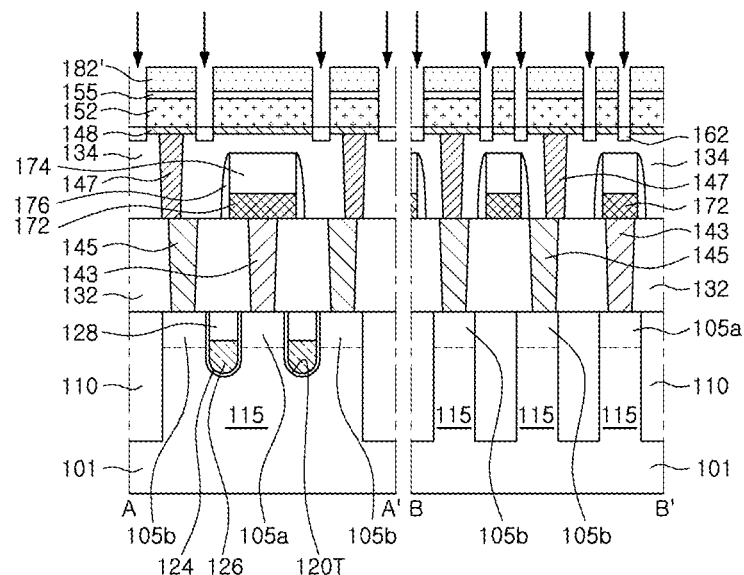

With reference to FIGS. 11A and 11B, the lower electrode layer 148 exposed between the mask patterns 182' may be oxidized to form a first layer 162 of the isolation insulating layer 160 (see FIG. 3).

The oxidation process of the lower electrode layer 148 may be carried out by implanting, for example, an oxygen ion, but is not limited thereto. The first layer 162 may have a depth deeper than a level of a lower surface of the lower electrode layer 148 from an upper surface thereof, but is not limited thereto. For example, the first layer 162 may have a depth so as to be identical to a level of the lower surface of the lower electrode layer 148, from the upper surface thereof. In the process described above with reference to FIGS. 10A and 10B, for example, when a portion of the first magnetic layer 152 remains, the remaining portion may be oxidized together with the oxidation of the lower electrode layer 148 in the process of FIGS. 11A and 11B. Here, the lower electrode layer 148 may be separated between memory cells adjacent to each other, to correspond to a form of the first magnetic layer 152.

According to an example embodiment, the process with reference to FIGS. 11A and 11B may be omitted, and in this case, at the time of patterning the first magnetic layer 152 in the process described above with reference to FIGS. 10A and 10B, the lower electrode layer 148 may be patterned also, or the lower electrode layer 148 may be separately patterned via an additional process.

Figure 12:
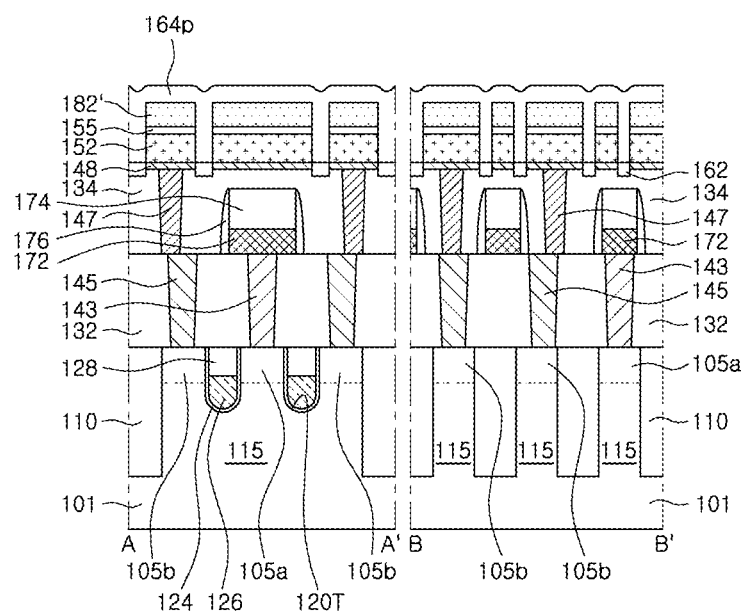

With reference to FIG. 12, a preliminary second layer 164p for the formation of a second layer 164 (see FIG. 3) of the isolation insulating layer 160 may be formed on the mask pattern 182' and the first layer 162.

The preliminary second layer 164p may fill a gap between the first magnetic layers 152. The preliminary second layer 164p may be formed using an insulating material, for example, silicon oxide or silicon nitride.

Figure 13:
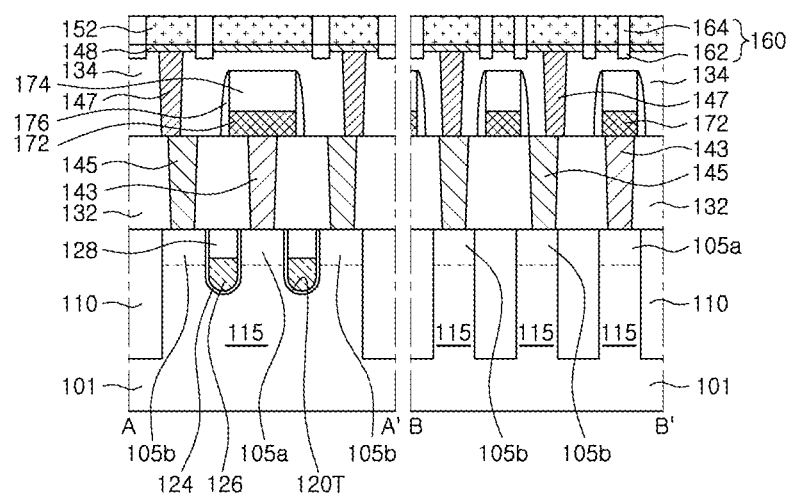

Referring to FIG. 13, a planarization process may be performed to allow an upper surface of the first magnetic layer 152 to be exposed.

The preliminary second layer 164p may be removed from an upper surface of the first magnetic layer 152 during the planarization process, and the second layer 164 of the isolation insulating layer 160 may be formed between the first magnetic layers 152. The planarization process may be performed using, for example, chemical mechanical polishing (CMP) or ion beam etching (IBE) among other processes. The planarization process may be performed a plurality of times while changing processing conditions according to example embodiments. In addition, the CMP process and the etching process may be alternately performed.

Although FIG. 13 illustrates the case in which the second layer 164 of the isolation insulating layer 160 and an upper surface of the first magnetic layer 152 are coplanar with each other, example embodiments are not limited thereto. For example, the second layer 164 may be polished or removed relatively easily as compared to the first magnetic layer 152, based on the materials of the second layer 164 and the first magnetic layer 152. Thus, at least a portion of the second layer 164 may have an upper surface of which a level is lower than the level of an upper surface of the first magnetic layer 152.

In the process, at the time of performing the planarization process, since a first magnetic layer 152 may further be disposed between the first magnetic layers 152 configuring memory cells, a formation area of the second layer 164 may be relatively small, and thus the non-uniformity in the planarization due to the occurrence of dishing or a recess in the second layer 164, may be reduced or substantially prevented. In detail, since a distance between the first magnetic layers 152, for example, a width of a region in which the second layer 164 is formed, is uniform, and the second layer 164 is symmetrical to a circumference of the first regions 152F and 152S (see FIG. 3), the uniformity may be further improved at the time of performing the planarization process. This is because even in the case of using the IBE, a shadowing phenomenon by the first magnetic layer 152 may occur symmetrically. Thus, substantial flatness of the first magnetic layer 152 may be achieved.

Figure 14:
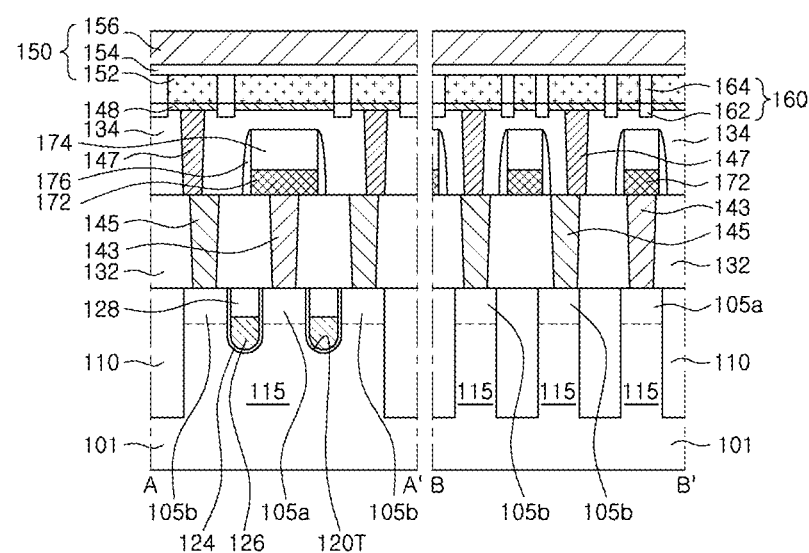

With reference to FIG. 14, a tunnel barrier layer 154 and a second magnetic layer 156 may be formed on the isolation insulating layer 160 and the first magnetic layer 152.

As such, the flatness of the first magnetic layer 152 may be achieved, and thus, at the time of growth of the second magnetic layer 156 formed, crystallinity may be achieved, so that degradation of magnetic memory element (ME) characteristics may be reduced or substantially prevented.

According to an example embodiment, in a case in which the first magnetic layer 152 is partially damaged during the planarization process, a material forming the first magnetic layer 152 may be additionally deposited and patterned before forming the tunnel barrier layer 154 and the second magnetic layer 156.

Then, with reference to FIG. 3, a third interlayer insulating layer 136 may be formed on the second magnetic layer 156.

Figure 15:
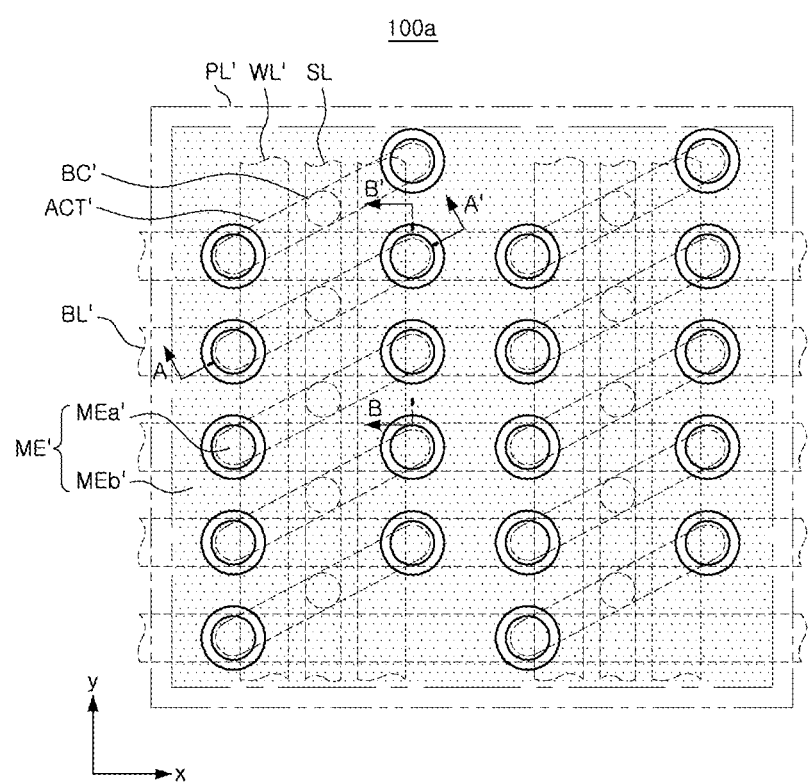
FIG. 15 is a schematic layout diagram of a memory cell array of a semiconductor device according to an example embodiment.

FIG. 15 is a schematic layout drawing of a memory cell array of a semiconductor device according to an example embodiment.

With reference to FIG. 15, a schematic layout of a portion of constituent elements in a memory cell array region included in a semiconductor device 100a is illustrated. The semiconductor device 100a may include a plurality of active regions ACT', a plurality of word lines WL' and bit lines BL' perpendicularly intersecting each other, a source line SL, and a magnetic memory element ME'.

The active regions ACT' may be two-dimensionally arranged in columns and rows in x and y directions. The active regions ACT' may have a rectangular shape or a bar shape extended in a direction of a desired angle with respect to extension directions of the word lines WL' and the bit lines BL'. In the active regions ACT', regions thereof not intersecting the word lines WL' may be provided as source regions or drain regions of selection devices SE (see FIG. 1) configured by the word lines WL'.

The word lines WL' may extend in a single direction, for example, in a y direction, on the active regions ACT'. For example, two word lines WL' may be disposed across one active region ACT'. In this case, a pair of selection devices SE, for example, transistors may be disposed on the active region ACT'.

The source lines SL may extend in the y direction between a pair of word lines WL' disposed across one active region ACT'. The source lines SL may be connected to the source regions through source line contact plugs BC'. Thus, the source line contact plugs BC' may apply a source voltage to the selection devices SE configured by word lines WL' adjacent thereto. Thus, the semiconductor device 100a according to the example embodiment may be configured in a different manner from the configuration illustrated in the circuit diagram of FIG. 1, and the source line SL may correspond to the bit line BL of FIG. 1.

The magnetic memory elements ME' may be disposed in the drain regions. The magnetic memory element ME' may include first and second regions MEa' and MEb'.

A first region MEa' may configure one memory cell. The first regions MEa' may be disposed on both end portions of one active region ACT'.

The second region MEb' may be spaced apart from the respective first regions MEa' by a desired distance while encompassing the first regions MEa', and may be provided as a single layer in the vicinity of the first regions MEa'. The second region MEb' may be substantially uniformly spaced apart from the first regions MEa' along circumferences thereof.

The bit lines BL' may extend in a single direction, for example, in the x direction, to be perpendicular with respect to the word lines WL'. The bit lines BL' may be electrically connected to the first regions MEa'. Thus, the semiconductor device 100a according to the example embodiment may be configured in a different manner from the configuration illustrated in the circuit diagram of FIG. 1, such that the bit lines BL' may be connected to the magnetic memory elements ME'.

Figure 16:
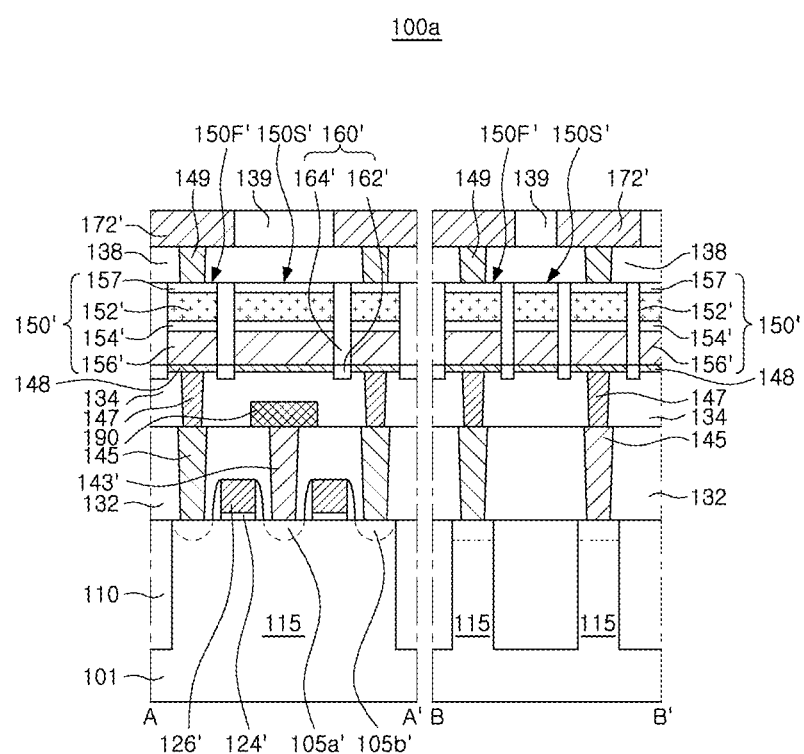
FIG. 16 is a schematic cross-sectional view of a memory cell array of a semiconductor device according to an example embodiment.

FIG. 16 is a schematic cross sectional view of a memory cell array of a semiconductor device according to an example embodiment. FIG. 16 illustrates a portion of a region including cross sections taken along lines A-A' and B-B' of FIG. 15. Hereinafter, a description overlapping the description of FIG. 3 will be omitted.

With reference to FIG. 16, a semiconductor device 100a may include a substrate 101, a device isolation layer 110 disposed in the substrate 101, an active region 115 defined by the device isolation layer 110 in the substrate 101, a source line 190, a magnetic memory element 150', and a bit line 172' disposed on the magnetic memory element 150'. The semiconductor device 100a may further include a first contact plug 143' connecting the source line 190 to the active region 115, a second contact plug 145 connecting the active region 115 to the magnetic memory element 150', a third contract plug 147, and a lower electrode layer 148.

The active region 115 may be defined by the device isolation layer 110, and a first impurity region 105a' and a second impurity region 105b', which may serve as a source region or a drain region, respectively, may be formed to have a desired depth from upper surfaces thereof in the active region 115. The first impurity region 105a' may be disposed between a pair of word lines 126' passing through one active region 115, and the second impurity region 105b' may be disposed outwardly of the word lines 126' in an active region 115. The first and second impurity regions 105a' and 105b' may include impurities having different conductivity types from those of the active region 115.

The word lines 126' may be disposed so that two word lines 126' are provided for each active region 115. The word line 126' may include a metal, metal nitride, or doped polysilicon. A gate insulating layer 124' may be disposed between the word line 126' and the active region 115. The gate insulating layer 124' may be configured of or include oxide, nitride, and oxynitride. The gate insulating layer 124' may include, for example, a silicon oxide layer or an insulating layer having a high dielectric constant.

The source line 190 may extend in the same direction as a direction in which the word line 126' is extended, above the word line 126'.

The first and second contact plugs 143' and 145' may penetrate through the first interlayer insulating layer 132 covering the word lines 126'. The first contact plug 143' may be disposed in the first impurity region 105a' and connected to the source line 190. The second contact plug 145 may be disposed in the second impurity region 105b' and connected to the third contact plug 147.

The second interlayer insulating layer 134 may cover the first and second contact plugs 143' and 145 and the first interlayer insulating layer 132. The third contact plug 147 may penetrate through the second interlayer insulating layer 134. The third contact plug 147 may connect the lower electrode layer 148 provided below the magnetic memory element 150' to the second contact plug 145, so that the magnetic memory element 150' may be electrically connected to the second impurity region 105b'.

The magnetic memory element 150' may include a first magnetic layer 152', a tunnel barrier layer 154', a second magnetic layer 156' and a cap electrode layer 157.

The first magnetic layer 152' may be provided as a free layer in which a magnetization direction thereof may be freely changed by an external magnetic field. The second magnetic layer 156' may be provided as a magnetic layer having a fixed magnetization direction. Although the example embodiment illustrates the case in which the second magnetic layer 156' is disposed below the first magnetic layer 152', example embodiments are not limited thereto. Positions of the first and second magnetic layers 152' and 156' may be changed according to example embodiments.

The magnetic memory element 150' may include first and second regions 150F' and 150S'. The first region 150F' may be electrically isolated from the second region 150S' provided in the vicinity thereof by an isolation insulating layer 160', in a manner that is the same as or similar to that of the first region MEa' illustrated in FIG. 15. The lower electrode layer 148 and the third contact plug 147 may be disposed below the first region 150F' so as to be electrically connected to the second impurity region 105b'. The lower electrode layer 148 may also be disposed below the second region 150S'. Here, the second region 150S' may be provided as, for example, a dummy magnetic memory element. Thus, the second region 150S' may not be electrically connected to other constituent elements such as the third contact plug 147 and may perform a function different from that of the first region 150F'.

The first and second magnetic layers 152' and 156' may include a ferromagnetic material. The first and second magnetic layers 152' and 156' may include at least one of, for example, cobalt (C), iron (Fe), and nickel (Ni), and may further include other elements, for example, boron (B), chrome (Cr), platinum (Pt), palladium (Pd), and the like. The first and second magnetic layers 152' and 156' may include at least one of CoFeB, CoFe, NiFe, CoFePt, CoFePd, CoFeCr, CoFeTb, CoFeGd, CoFeNi, CoFe, NiFe, and the like.

The first and second magnetic layers 152' and 156' may have a magnetization direction in a direction parallel to a direction of an upper surface of the substrate 101 or in a direction perpendicular thereto. The first magnetic layer 152' may have a changeable magnetization direction, for example, a direction parallel to a direction of the second magnetic layer 156' or a direction anti-parallel thereto. In addition, the first and second magnetic layers 152' and 156' may respectively include a plurality of layers.

The tunnel barrier layer 154' may be disposed between the first and second magnetic layers 152' and 156'. The tunnel barrier layer 154' may include an insulating material. The tunnel barrier layer 154' may include at least one of, for example, magnesium oxide, titanium oxide, aluminum oxide, magnesium-zinc oxide, or magnesium-boron oxide, but is not limited thereto.

The isolation insulating layer 160' may include first and second layers 162' and 164'. The first layer 162' may be disposed on a lateral surface of the lower electrode layer 148 and may extend into the second interlayer insulating layer 134 to have a desired depth from an upper surface thereof. The second layer 164' may be disposed on a lateral surface of the magnetic memory element 150'. An upper surface of the second layer 164' is illustrated as having a surface coplanar with an upper surface of the cap electrode layer 157, but is not limited thereto. For example, according to an example embodiment, a level of the upper surface of the second layer 164' may be lower or higher than the level of the upper surface of the cap electrode layer 157.

Fourth and fifth interlayer insulating layers 138 and 139 may be disposed on the magnetic memory element 150'. A fourth contact plug 149 penetrating through the fourth interlayer insulating layer 138 and a bit line 172' within the fifth interlayer insulating layer 139 may be further disposed. The bit line 172' may be connected to the first region 150F' of the magnetic memory element 150' through the fourth contact plug 149.

In an embodiment, a three dimensional (3D) memory array may be provided. The 3D memory array may be formed, for example monolithically formed, in one or more physical levels of arrays of memory cells having an active region disposed above a silicon substrate and circuitry associated with the operation of those memory cells, whether such associated circuitry is above or within such substrate. The term "monolithic" means that layers of each level of the array are directly deposited on the layers of each underlying level of the array.

Figure 17:
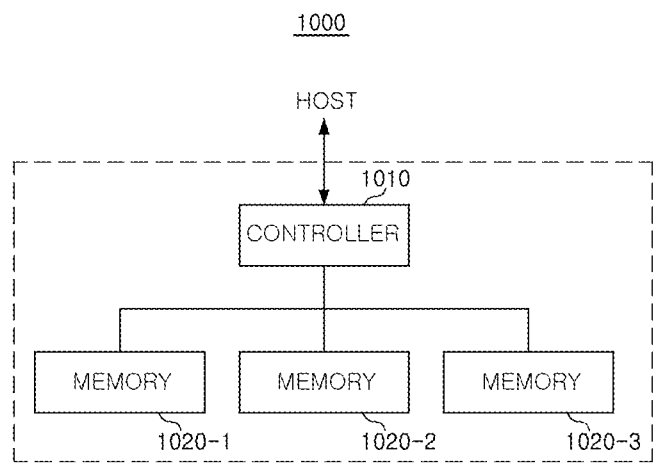
FIG. 17 is a block diagram of a storage apparatus including a semiconductor device according to example embodiments.

FIG. 17 is a block diagram of a storage apparatus including a semiconductor device according to example embodiments.

With reference to FIG. 17, the storage apparatus 1000 according to an example embodiment may include a controller 1010 communicating with a host HOST and memories 1020-1, 1020-2, and 1020-3 storing data. The respective memories 1020-1, 1020-2, and 1020-3 may include a semiconductor device according to various example embodiments as described above with reference to FIGS. 1 to 16.

The host HOST communicating with the controller 1010 may be various electronic devices in which the storage apparatus 1000 is installed, and for example, may be provided as a smartphone, a digital camera, a desktop computer, a laptop computer, a media player, or the like. The controller 1010 may receive a data writing or data reading request transferred by the host HOST to enable data to be written to the memories 1020-1, 1020-2, and 1020-3 or may generate a command to allow data to read from the memories 1020-1, 1020-2, and 1020-3.

As illustrated in FIG. 17, one or more memories 1020-1, 1020-2, and 1020-3 may be connected to the controller 1010 in parallel within the storage apparatus 1000. The storage apparatus 1000 having a large capacity as in a solid state drive (SSD) may be implemented by connecting the plurality of memories 1020-1, 1020-2, and 1020-3 to the controller 1010 in parallel.

Figure 18:
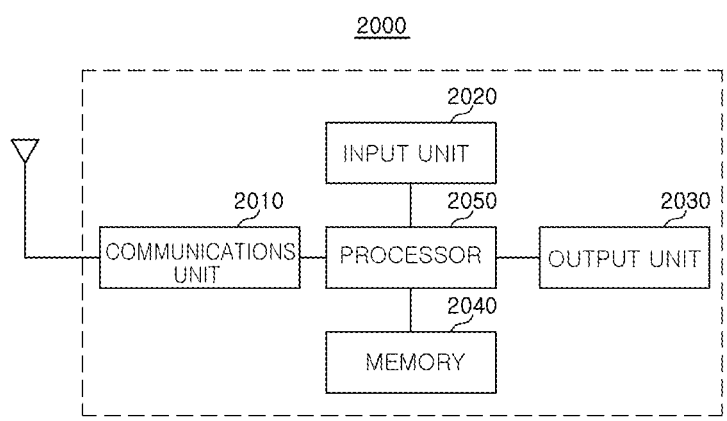
FIG. 18 is a block diagram of an electronic device including a semiconductor device according to example embodiments.

FIG. 18 is a block diagram of an electronic device including a semiconductor device according to example embodiments.

With reference to FIG. 18, an electronic device 2000 according to the example embodiment may include a communications unit 2010, an input unit 2020, an output unit 2030, a memory 2040, and a processor 2050.

The communications unit 2010 may include a wired and wireless communications module and may include a wireless internet module, a near-field communications module, a global positioning system (GPS) module, a mobile communications module, and the like. The wired and wireless communications module included in the communications unit 2010 may be connected to an external communications network via various communications protocols to transmit or receive data.

The input unit 2020 may be a module provided to control operations of the electronic device 2000 by a user, and may include a mechanical switch, a touchscreen, a sound recognition module, and the like. In addition, the input unit 2020 may also include a mouse operating in a trackball or laser pointer scheme or the like, or a finger mouse device, and also, may further include various sensor modules through which data may be input by a user.

The output unit 2030 may output information processed by the electronic device 2000 in audio or visual form, and the memory 2040 may store a program for processing or controlling by the processor 2050, data, or the like. The memory 2040 may include one or more semiconductor devices according to various example embodiments as described above with reference to FIGS. 1 to 16. The processor 2050 may transfer a command to the memory 2040 according to a required operation to thus write data thereto or read data therefrom.

The memory 2040 may be embedded in the electronic device 2000 or may communicate with the processor 2050 via a separate interface. In the case of communicating with the processor 2050 via the separate interface, the processor 2050 may write data to the memory 2040 or read data therefrom via various interface standards such as SD, SDHC, SDXC, MICRO SD, USB, and the like.

The processor 2050 may control operations of respective parts included in the electronic device 2000. The processor 2050 may perform controlling and processing relevant to voice communication, video communication, data communications, and the like, or may also perform controlling and processing for multimedia playback and management. The processor 2050 may process an input transferred through the input unit 2020 by a user and may output the result thereof via the output unit 2030. In addition, the processor 2050 may write data required to control operations of the electronic device 2000 to the memory 2040 or read data therefrom.

Figure 19:
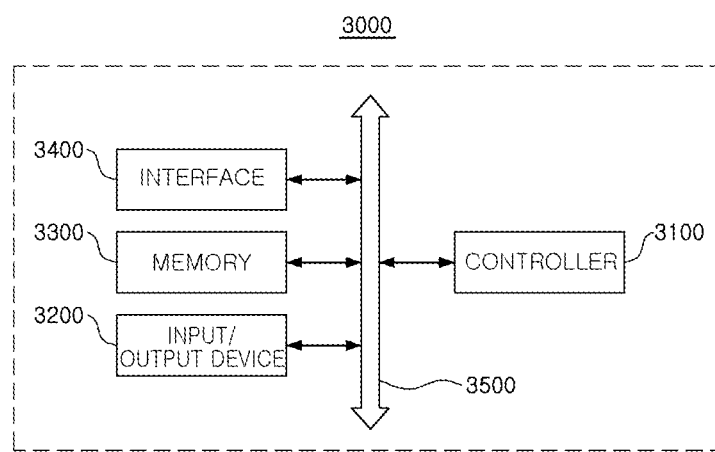
FIG. 19 is a schematic view of a system including a semiconductor device according to example embodiments.

FIG. 19 is a schematic view of a system including a semiconductor device according to example embodiments.

With reference to FIG. 19, a system 3000 may include a controller 3100, an input/output device 3200, a memory 3300, and an interface 3400. The system 3000 may be a mobile system or a system transmitting or receiving information. The mobile system may be provided as a personal digital assistant (PDA), a portable computer, a web tablet, a wireless phone, a mobile phone, a digital music player or a memory card.

The controller 3100 may execute a program and may serve to control the system 3000. The controller 3100 may be provided as, for example, a microprocessor, a digital signal processor, a microcontroller or a device that is the same as or similar thereto.

The input/output device 3200 may be used to input or output data of the system 3000. The system 3000 may be connected to an external device, for example, a personal computer or a network to exchange data therebetween using the input/output device 3200. The input/output device 3200 may be provided as, for example, a keypad, a keyboard, or a display.

The memory 3300 may store a code and/or data for operations of the controller 3100, and/or may store data processed by the controller 3100 therein. The memory 3300 may include a semiconductor device according to one of the example embodiments.

The interface 3400 may serve as a data transmission path between the system 3000 and an external, different device. The controller 3100, the input/output device 3200, the memory 3300, and the interface 3400 may communicate with one another via a bus 3500.

At least one of the controller 3100 or the memory 3300 may include one or more semiconductor devices as described above with reference to FIGS. 1 to 16.

According to example embodiments, a semiconductor device having improved reliability may be provided by forming a magnetic layer pattern in the vicinity of a magnetic layer to reduce or substantially prevent the occurrence of defects during a planarization process.

While example embodiments have been shown and described above, it will be apparent to those skilled in the art that modifications and variations could be made without departing from the scope as defined by the appended claims.

What is claimed is:

1. A semiconductor device comprising:
a first magnetic layer including a plurality of first regions configured as a plurality of memory cells and spaced apart from each other on a substrate, and a second region continuously encompassing the plurality of first regions and electrically isolated from the plurality of first regions;

a tunnel barrier layer on the first magnetic layer; and a second magnetic layer on the tunnel barrier layer.

2. The semiconductor device of claim 1, wherein the plurality of first regions are arranged in rows and columns, and the second region includes a single layer in the vicinity of the plurality of first regions.

3. The semiconductor device of claim 1, wherein the second region is spaced apart from the plurality of first regions and includes substantially uniform gaps along circumferences of the plurality of first regions.

4. The semiconductor device of claim 1, further comprising an isolation insulating layer between the first region and the second region.

5. The semiconductor device of claim 4, wherein a width of the isolation insulating layer is narrower than a width of the first region.

6. The semiconductor device of claim 1, further comprising a lower electrode below at least one of the plurality of first regions and electrically connected to at least one of the plurality of first regions.

7. The semiconductor device of claim 6, wherein the lower electrode comprises a contact plug electrically connected to a selection device, and a lower electrode layer on the contact plug, the lower electrode layer being below the second region.

8. The semiconductor device of claim 7, wherein a region of the lower electrode layer that is below the second region is substantially electrically isolated from the contact plug.

9. The semiconductor device of claim 4, wherein the tunnel barrier layer covers the first magnetic layer and the isolation insulating layer.

10. The semiconductor device of claim 1, wherein the second magnetic layer is a single layer covering the tunnel barrier layer.

11. The semiconductor device of claim 1, wherein the second magnetic layer and the tunnel barrier layer have a pattern corresponding to a pattern of the first magnetic layer.

12. The semiconductor device of claim 1, wherein the second region surrounds an entire side surface of the plurality of first regions.

13. A semiconductor device comprising:

a plurality of magnetic memory elements on a substrate, the magnetic memory elements being configured as a plurality of memory cells and including a first magnetic layer, a tunnel barrier layer contacting the first magnetic layer, and a second magnetic layer contacting the tunnel barrier layer; and a plurality of selection devices on the substrate or within the substrate, wherein the first magnetic layer includes a plurality of first regions electrically connected to the plurality of selection devices and spaced apart from each other, and a second region continuously encompassing the plurality of first regions and electrically isolated from the plurality of first regions.

14. The semiconductor device of claim 13, further comprising bit lines electrically connected to the plurality of selection devices.

15. The semiconductor device of claim 13, further comprising an isolation insulating layer between the plurality of first regions and the second region, wherein the second magnetic layer covers a top surface of the isolation insulating layer.

16. A semiconductor device comprising:

a first magnetic layer on a substrate, the first magnetic layer including a plurality of first regions and a second region continuously encompassing the plurality of first regions;

an insulating layer between the plurality of first regions and the second region; and a second magnetic layer on the first magnetic layer; wherein an upper surface of the plurality of first regions and an upper surface of the second region are co-planar; and a degree of crystallinity of the second magnetic layer is increased due to the upper surface of the plurality of first regions and the upper surface of the second region being co-planar.

17. The semiconductor device of claim 16, further comprising:

a tunnel barrier layer between the first magnetic layer and the second magnetic layer.

18. The semiconductor device of claim 16, wherein the first region is at least one of spatially and electrically isolated from the plurality of first regions.

19. The semiconductor device of claim 16, wherein the tunnel barrier layer is in contact with the first magnetic layer, and the second magnetic layer is in contact with the tunnel barrier layer.

20. The semiconductor device of claim 16, wherein the second region surrounds an entire side surface of the plurality of first regions.

* * * * *